United States Patent
Kadlec et al.

(10) Patent No.: US 7,138,343 B2
(45) Date of Patent: Nov. 21, 2006

(54) METHOD OF PRODUCING A SUBSTRATE WITH A SURFACE TREATED BY A VACUUM TREATMENT PROCESS, USE OF SAID METHOD FOR THE PRODUCTION OF COATED WORKPIECES AND PLASMA TREATMENT CHAMBER

(75) Inventors: Stanislav Kadlec, Buchs (CH); Eduard Kügler, Feldkirch-Tisis (AT); Thomas Halter, Sennwald (CH)

(73) Assignee: OC Oerlikon Balzers AG, Balzers (LI)

( * ) Notice: Subject to any disclaimer, the term of this patent is extended or adjusted under 35 U.S.C. 154(b) by 0 days.

(21) Appl. No.: 10/536,204

(22) PCT Filed: Nov. 13, 2003

(86) PCT No.: PCT/CH03/00744

§ 371 (c)(1),
(2), (4) Date: May 24, 2005

(87) PCT Pub. No.: WO2004/050943

PCT Pub. Date: Jun. 17, 2004

(65) Prior Publication Data

US 2006/0054493 A1    Mar. 16, 2006

(30) Foreign Application Priority Data

Nov. 29, 2002    (CH)    .................................. 2019/02

(51) Int. Cl.
*H01L 21/26*    (2006.01)

(52) U.S. Cl. ................. 438/795; 204/192.1; 118/723 E; 257/E21.347

(58) Field of Classification Search ................. 438/795; 118/723 E; 204/192.1, 192.12
See application file for complete search history.

(56) References Cited

U.S. PATENT DOCUMENTS

| | | | | |
|---|---|---|---|---|
| 4,526,643 | A * | 7/1985 | Okano et al. | 156/345.46 |
| 4,668,365 | A * | 5/1987 | Foster et al. | 204/192.23 |
| 4,858,556 | A * | 8/1989 | Siebert | 118/664 |
| 5,431,769 | A * | 7/1995 | Kisakibaru et al. | 156/345.46 |
| 5,500,077 | A * | 3/1996 | Nishibayashi et al. | 216/38 |
| 5,529,671 | A * | 6/1996 | Debley et al. | 204/192.34 |
| 5,945,008 | A * | 8/1999 | Kisakibaru et al. | 216/71 |
| 6,255,220 | B1 * | 7/2001 | Kisakibaru et al. | 438/707 |
| 6,290,825 | B1 * | 9/2001 | Fu | 204/298.2 |
| 6,413,382 | B1 | 7/2002 | Wang et al. | |
| 6,767,475 | B1 * | 7/2004 | Mearini et al. | 216/38 |
| 2001/0010255 | A1 | 8/2001 | Kijima | |
| 2002/0162737 | A1 | 11/2002 | Durs | |
| 2003/0164998 | A1 * | 9/2003 | Mirkarimi et al. | 359/237 |

FOREIGN PATENT DOCUMENTS

| WO | WO 02/103078 | 12/2002 |
|---|---|---|
| WO | WO 2004/036616 | 4/2004 |

* cited by examiner

*Primary Examiner*—W. David Coleman
(74) *Attorney, Agent, or Firm*—Notaro & Michalos P.C.

(57) ABSTRACT

In order to produce substrate surfaces with a given two-dimensional surface distribution arising from a treatment using a vacuum treatment process, an inhomogeneous plasma (5) with a density distribution is generated and moved relative to the substrate (9) with a given movement.

22 Claims, 10 Drawing Sheets

Figure 1:
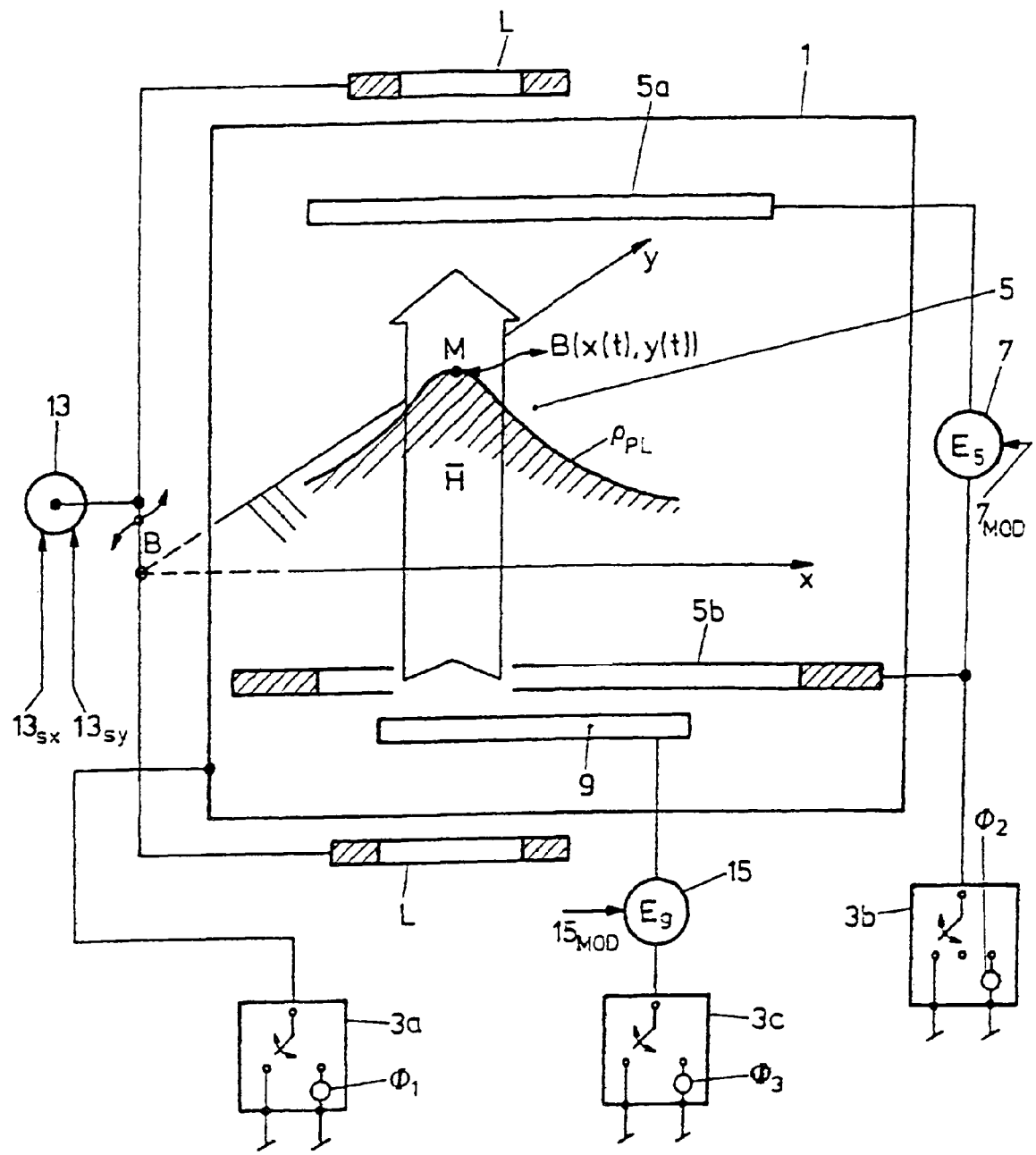

METHOD OF PRODUCING A SUBSTRATE WITH A SURFACE TREATED BY A VACUUM TREATMENT PROCESS, USE OF SAID METHOD FOR THE PRODUCTION OF COATED WORKPIECES AND PLASMA TREATMENT CHAMBER

The present invention arises from requirements encountered during magnetron sputter coating of substrates. However, it was found that the solution resulting from the present invention can be generally employed for substrate surfaces treated by vacuum treatment processes.

DEFINITION

Within the scope of the present application by vacuum treatment process and, correspondingly, by its effect on a substrate, is understood a process
 a) in which with plasma enhancement material is removed from the substrate surface, as in reactive or non-reactive plasma etching,
 b) in which material on the substrate surface is modified, as in reactive plasma-enhanced secondary treatment, for example afteroxidation of the substrate surface material,
 c) in which material is applied onto the substrate surface, be this reactively or non-reactively or by means of plasma-enhanced CVD. If therein material is released from the solid phase into the process atmosphere and, after reaction with gas, is deposited on the substrate surface, a process under consideration is exclusively understood as one in which the release of said material from the solid phase takes place at a material source at which the solid phase of only a single material is present.

If two or more sources are present with different materials in the solid phase for release into the process atmosphere, each of the release processes and, correspondingly, the coating processes of the, or with the, individual materials is considered as a vacuum treatment process by itself. In such a case two and more treatment processes are carried out simultaneously.

In magnetron sputter coated substrate surfaces it is today already possible to attain good coating thickness distribution, if viewing this distribution takes place in cutting planes perpendicular to the surface of the substrate. However, if the coating thickness distributions resulting in said cutting planes, in which each is assessed as good to very good, are compared among themselves—thus from cutting plane to cutting plane—then, if they are considered two-dimensionally as a coating thickness distribution over the surface, the distribution is found to be unsatisfactory.

If, for example, on sputter-coated circular disk-shaped substrates the layer thickness is received along the substrate periphery, a distribution results which for many application purposes is entirely unsatisfactory.

The present invention has as its fundamental aim to propose a method for the production of a substrate with a surface treated by a vacuum treatment process, in which the surface has a specified two-dimensional areal distribution of the treatment result. The solution found according to the present invention comprises:
 establishing a plasma discharge with a locally inhomogeneous density distribution,
 exposing the substrate to the action of the inhomogeneous density-distributed plasma discharge, and
 establishing the distribution of the treatment result by
 establishing a specified relative movement of the inhomogeneous density distribution and the substrate,
 establishing a specified time variation of the electric power, which supplies the discharge and/or of an optionally provided further electric signal, which places the substrate at bias voltage,
 setting said variation and said movement.

For example in order to attain a specified homogeneous areal distribution of the treatment results, contrary to what might be expected, not as homogeneous a density-distributed plasma discharge is targeted but rather a plasma distribution which is locally inhomogeneous, i.e. has noticeable regions of plasma density which are increased compared to other regions. Through the specific setting of the relative movement of the inhomogeneous density distribution and the power variation, the areal distribution of the treatment result on the substrate surface is set.

Both parameters, said movement and said time variation, are consequently employed as independent parameters or variables to be set of the function "treatment result distribution" depending thereon.

EP 1 254 970 by the same applicant as of the present invention discloses the following: Different materials are released into the process atmosphere from a magnetron sputter configuration. Target parts comprised of different materials form each a source at which the particular material is released into the process atmosphere. The individual solid substance sources are therein operated from a common magnetron configuration. In order to set the particular sputter conditions at the two sources with different materials, and to do this by means of a single magnetron configuration, on the one hand, the magnetic field of the magnetron configuration is moved over the provided target parts, consequently it is also moved relative to the substrate, and, specific to the target part material, with the magnetic field movement over the two sources, the sputter power is also varied in time. It is therewith possible to take into account the different sputter characteristics of the two sources in a constructionally extremely simple manner from a magnetron configuration.

In a preferred embodiment variant the plasma discharge is established with at least one region of pronounced density maximum.

Establishing the specified relative movement is realized in a first embodiment thereby that the substrate is moved with respect to a vacuum receptacle, in which the discharge is generated. The inhomogeneously density-distributed plasma discharge with its density maxima and density minima loci can be maintained stationarily in the receptacle or also be moved therein.

However, in a preferred embodiment, furthermore preferably while maintaining the substrate stationarily, establishing the specified relative movement is established through a specified movement of the inhomogeneous density distribution with respect to the vacuum receptacle.

In a further preferred embodiment of the production method according to the invention the inhomogeneous density distribution is generated at least jointly through the contribution by means of a magnetic field.

According to an especially preferred embodiment therewith a simple capability is provided for realizing the relative movement of the inhomogeneous plasma density distribution thereby that the equally inhomogeneous magnetic field distribution is moved in the receptacle in which the discharge is established.

The plasma discharge is generated by means of DC, AC, DC and superimposed AC or by means of HF. Optionally the substrate can analogously be connected to bias voltage by means of DC, AC, DC and superimposed AC or HF, and in this case, preferably additionally to the variation of the electric signal operating the plasma discharge, this bias signal is varied in time as specified. If in the present context a time variation of an AC signal is discussed, it addresses its angle or amplitude variations, thus its modulation.

In a highly preferred embodiment of the method according to the invention the vacuum treatment process is formed as a magnetron sputter process, and the specified relative movement is at least also realized through a specified movement of the magnetron tunnel field with respect to a target sputter surface.

It is known that during magnetron sputtering, a magnetic field is generated above the sputter surface of the target, which field forms one or more tunnel-shaped field line patterns with field lines emerging from the sputter surface and extending in a segment substantially parallel to the target surface subsequently enter again into the sputter surface. Through known effects, namely electron trap effects, a tube-shaped region of increased plasma density is generated concentrated in the area of the field lines in which they extend parallel to the sputter surface. In this region of increased plasma density the erosion of the sputter surface is increased, which, in connection with magnetron sputtering, leads to the known erosion grooves. In order to utilize better in particular the target material, it is known to move the field line pattern along the sputter surface during the sputter coating primarily by providing moved magnet configurations beneath the target.

Based thereon it is evident that magnetron sputtering is eminently suitable for a course of action according to the present method, since means are here already available for moving an inhomogeneous plasma density distribution with respect to a substrate.

Consequently, and basically preferred, the relative movement of the locally inhomogeneous density distribution of the plasma with respect to the substrate is realized by the mechanical movement of a magnetic field-generating configuration outside and/or inside the vacuum receptacle.

Such configurations are for example realized with electromagnets, coil configurations, such as for example Helmholtz coils, deflection coils, in magnetrons with magnet configurations under the target which rotate or are moved in given X and Y movements, linearly and with mutual dependence.

However, instead of a mechanical movement the magnetic field can also be moved electrically by controlled time-variable driving of fixedly installed coil configurations. It is entirely possible to combine mechanical movement of magnetic field generators and electric time-variable driving of coils, which can additionally also be moved mechanically.

The movement of the substrate, considered under the aspect of realization, is currently less preferred.

In a further preferred embodiment of the method according to the invention the specified relative movement as well as the specified time variation are each established to be periodic and their dependence is established through synchronization. It should be noted that in general it is not required to form the particular established periodicities to be identical. The periods of said time variation and said relative movement can be quite different, and specifically such that the one period is an integer multiple of the other or such that the periods have a non-integer relationship with respect to one another.

In a further preferred embodiment of the method according to the invention with the aid of the discharge a solid substance is released into the treatment atmosphere. Further, into said atmosphere a reactive gas is introduced. The distribution of the compound relationship between solid substance and components of the reactive gas on the surface is set as the treatment result.

If, for example a metal is released as the solid substance into the treatment atmosphere with the reactive gas, the distribution of the stoichiometry of the compound material deposited on the surface is set in the sense of the treatment result to be attained.

In an especially preferred embodiment of the method according to the invention the treatment result is a coating of said surfaces. However, the treatment result can therein also be the etching of the treatment surface, both, coating or etching, reactive or non-reactive.

In a further preferred embodiment of the method according to the invention an intermediate treatment result is measured before the end of the treatment, compared with a nominal intermediate treatment result and, as a function of the comparison result, the specified relative movement and/or the time variation is readjusted. Said measurement takes place in further preference without vacuum interruption. The substrate can therein be transported from one vacuum into the other, for example from the treatment atmosphere into a measuring atmosphere, or, further preferred, said measurement is carried out in situ during the substrate treatment, thus in the treatment process atmosphere. As is further preferred, the measurement result is supplied as a measured controlled variable to a control circuit, which sets the specified relative movement and/or time variation as the correcting variable for the treatment result regulation.

The proposed method is especially suitable for the production of components operating on the basis of acoustic surface waves or on the basis of "bulk acoustic waves".

A plasma treatment chamber according to the invention, in particular for carrying out the production method according to the invention, is specified in claim 20, preferred embodiments thereof in claims 21 and 22.

Figure 2:
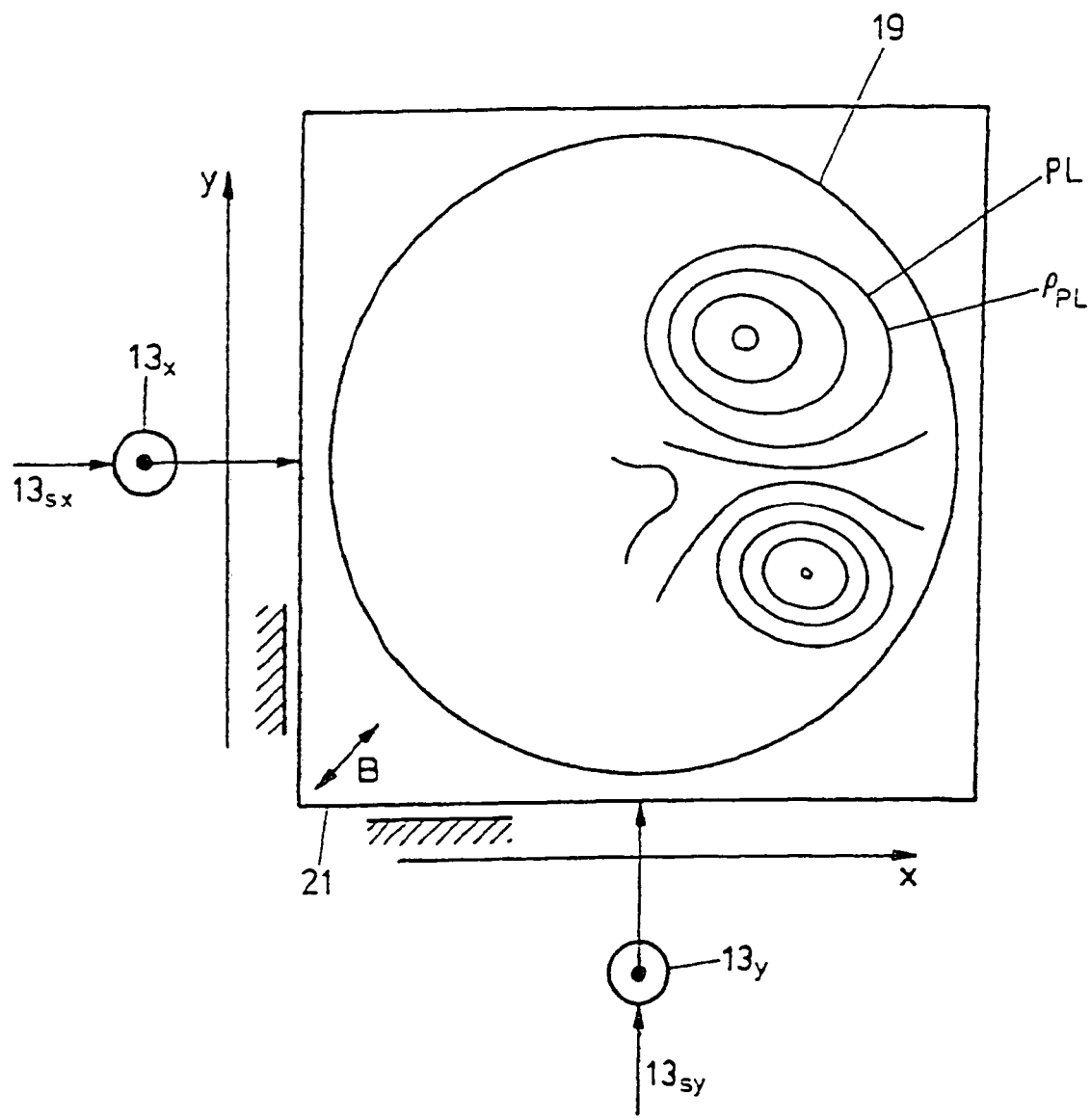
Figure 3:
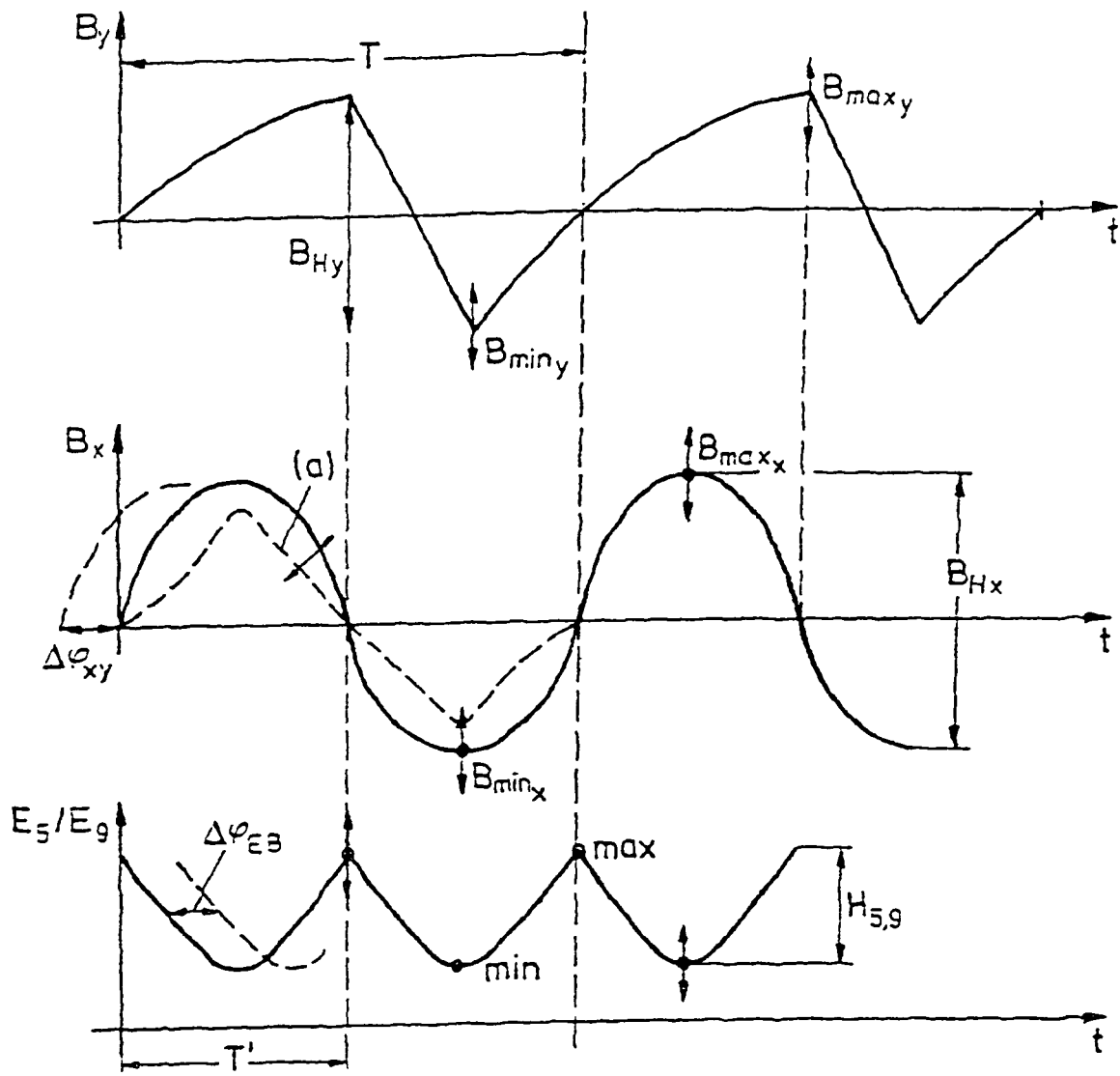
Figure 4:
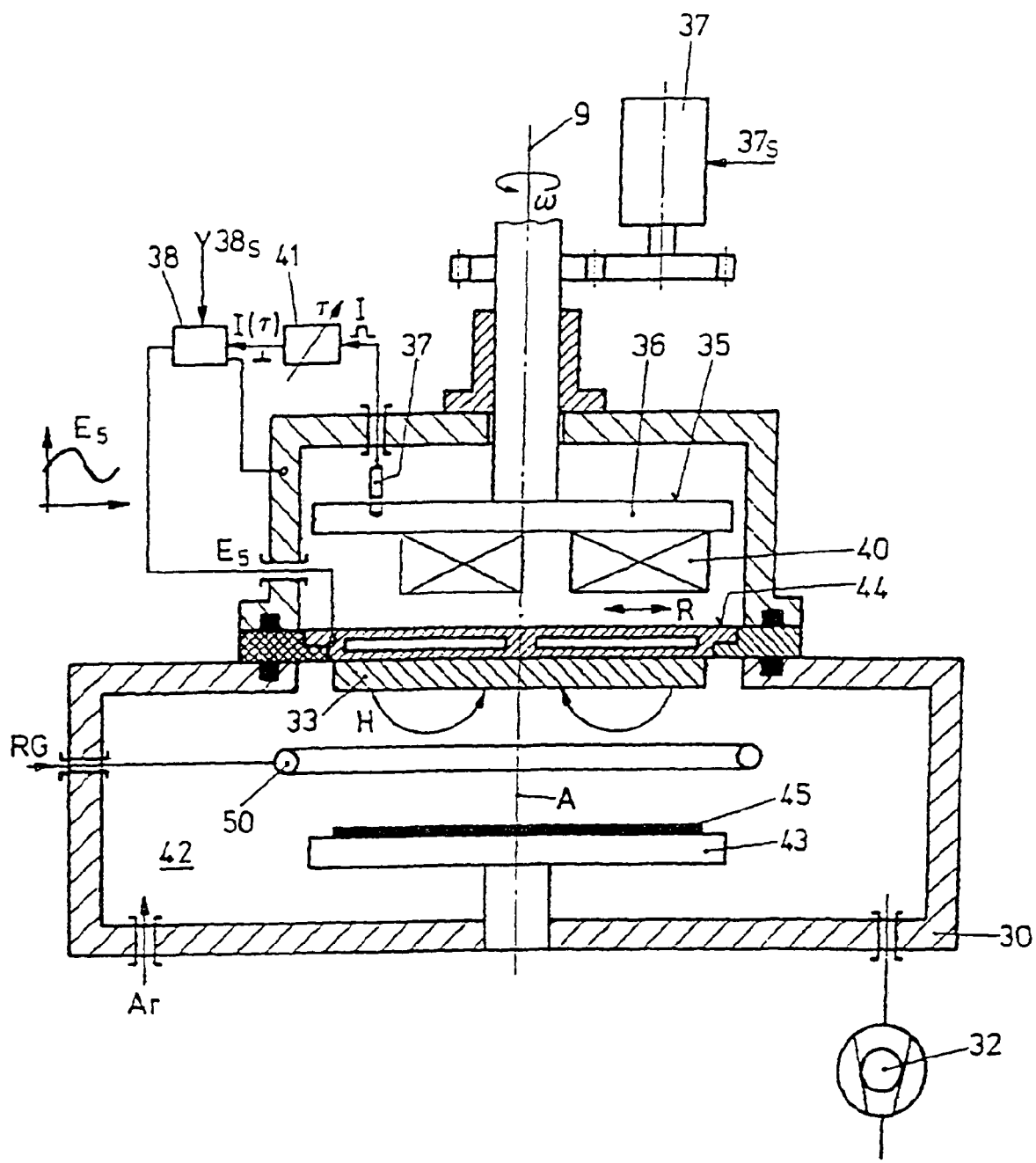
Figure 5:
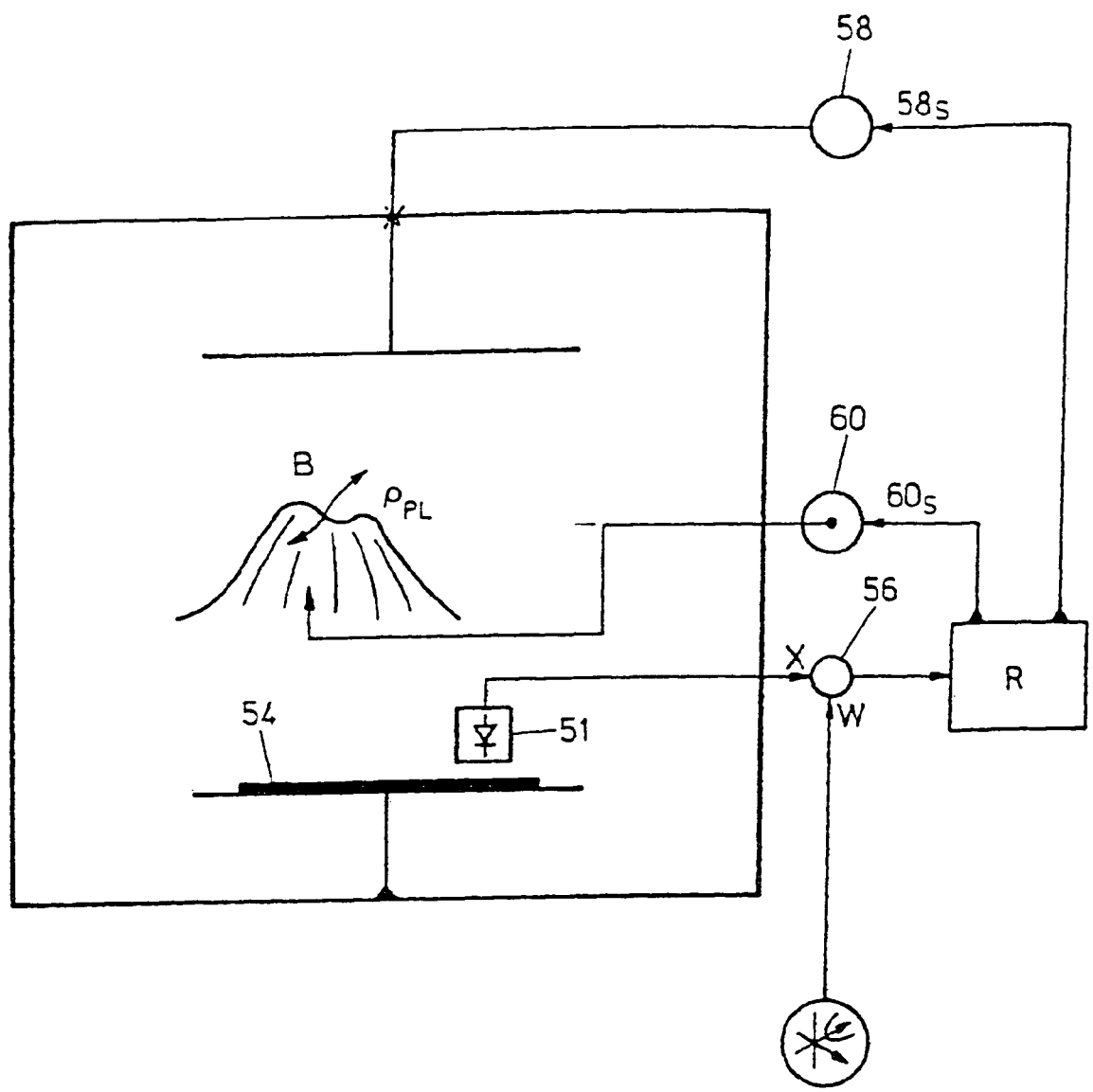
Figure 6:
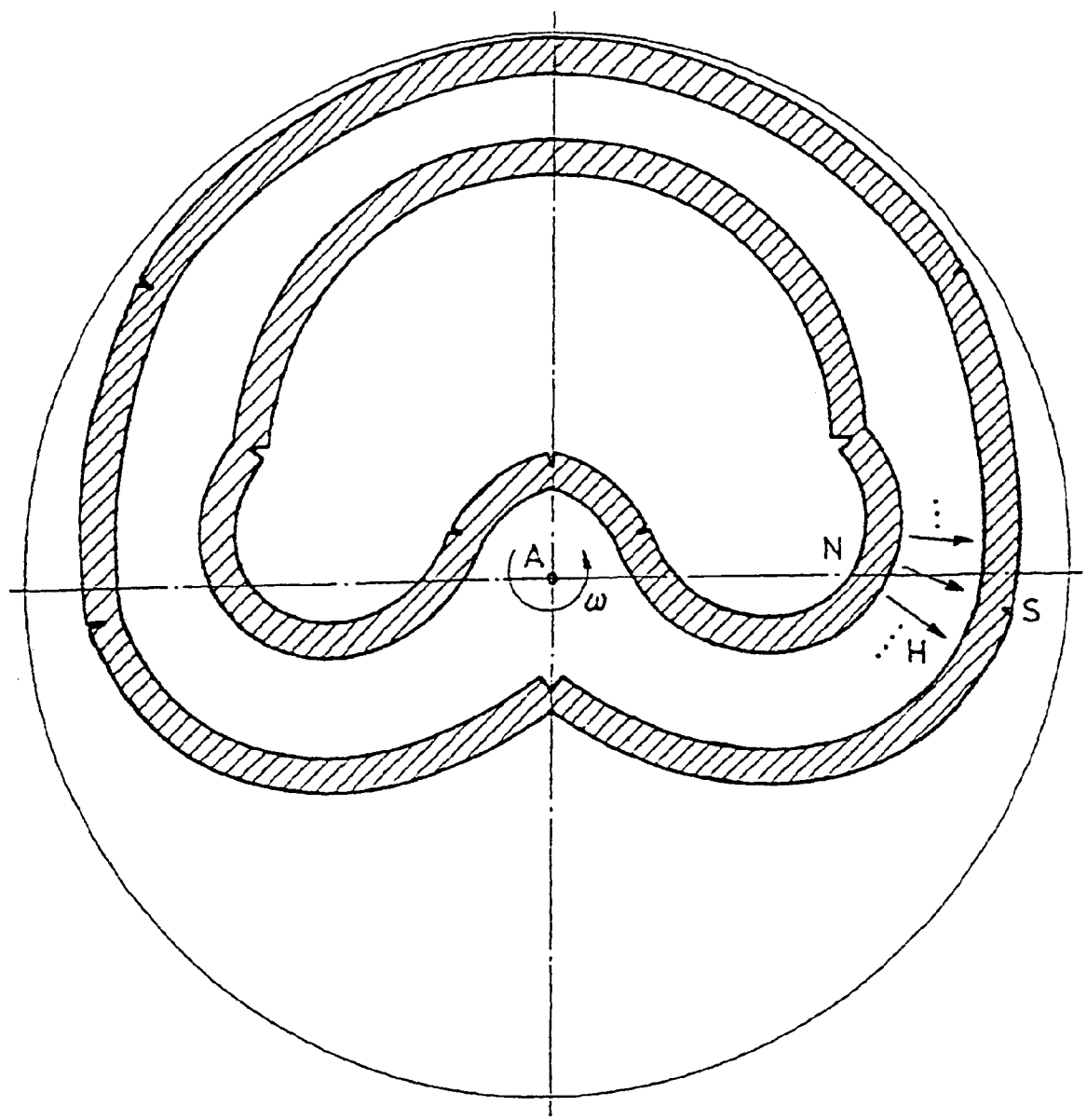
Figure 12:
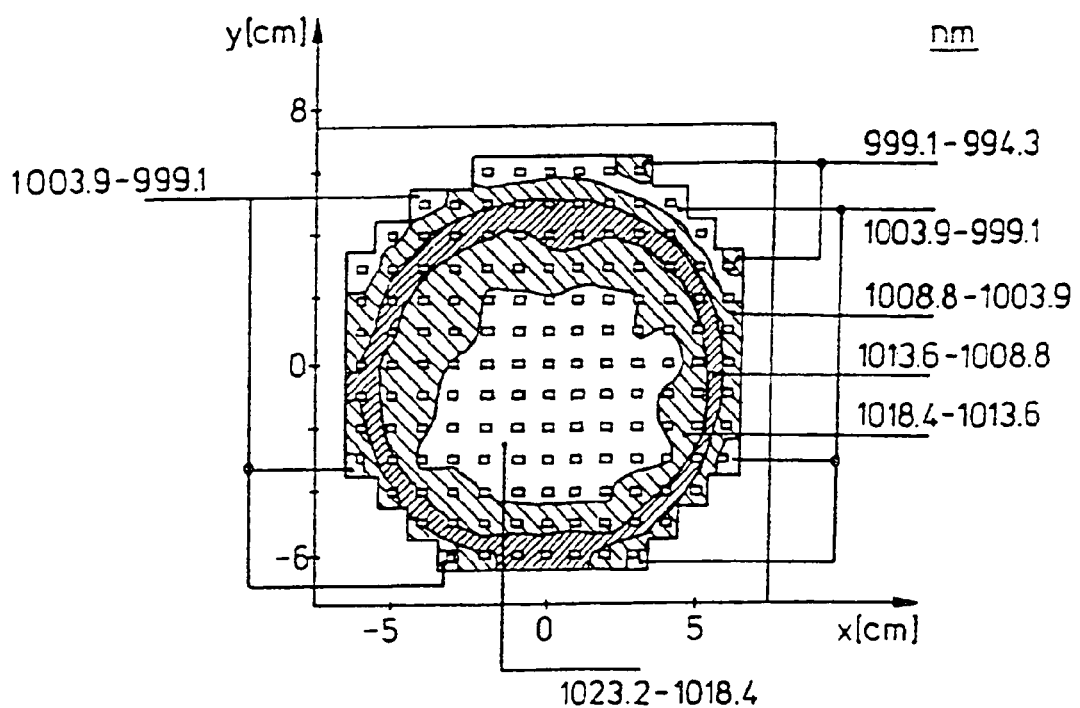
Figure 13:
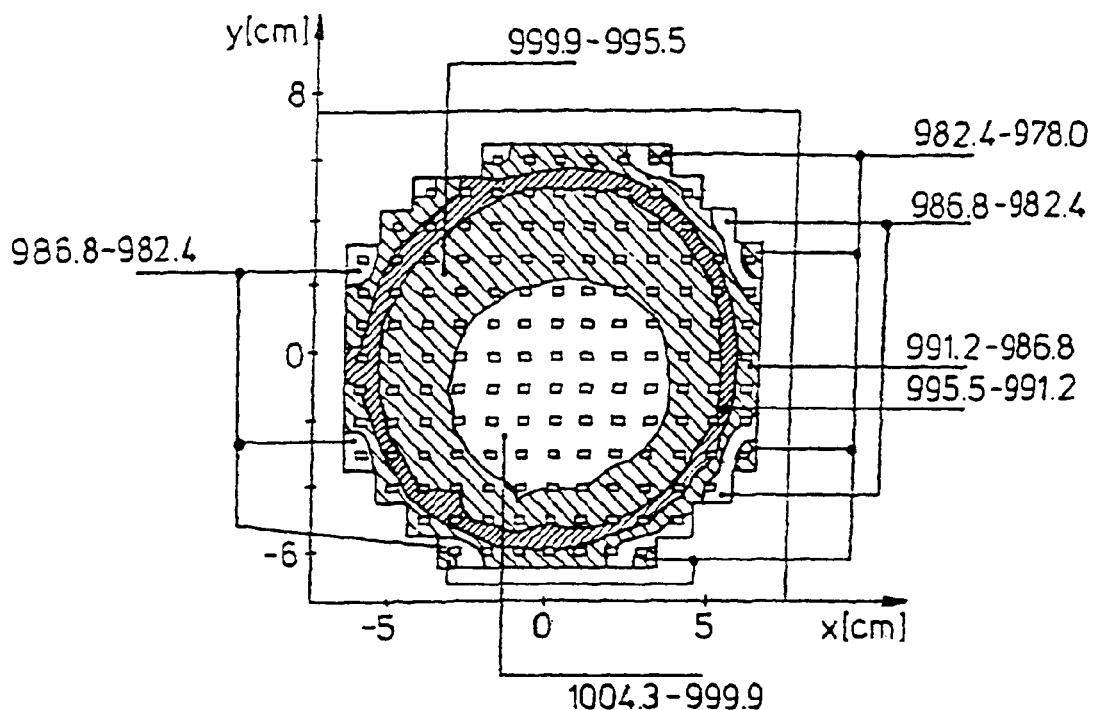
Figure 14:
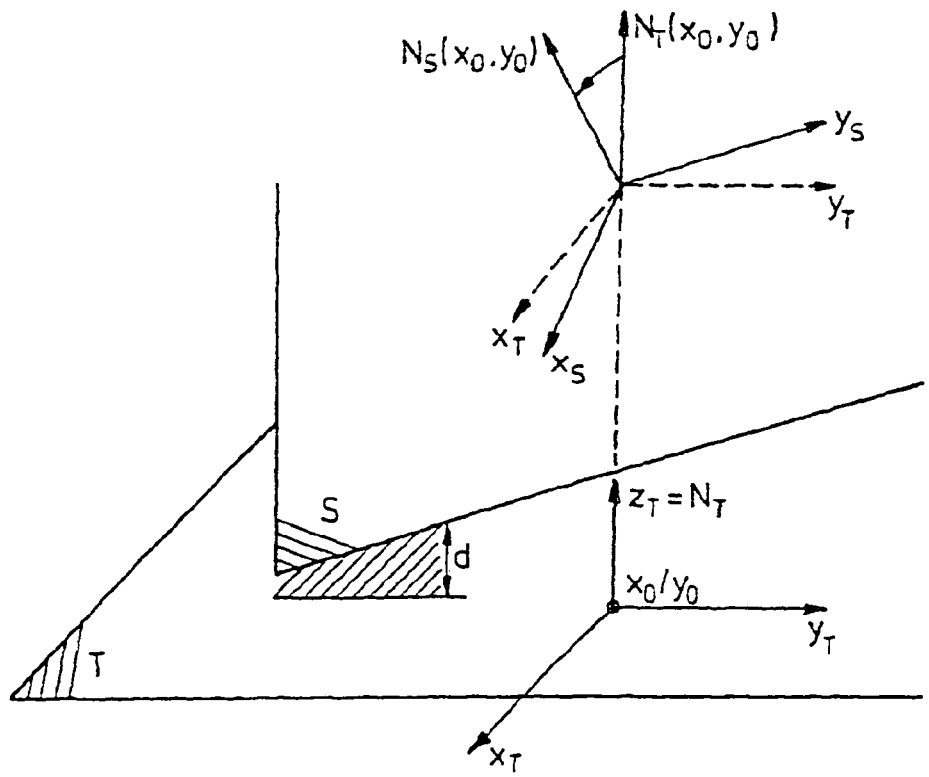

In the following the invention will be explained by example in conjunction with figures. Therein depict:

FIG. 1 schematically, a treatment chamber according to the invention utilized for carrying out the production method according to the invention, as well as for a fundamental explanation of the present invention, FIG. 2 again schematically, in top view a substrate moved according to the present invention in an inhomogeneously density-distributed plasma, FIG. 3 exemplary movement course between a substrate and an inhomogeneous density distribution of a plasma as well as by example a time trace of the electric power supplying the plasma, FIG. 4 simplified and in longitudinal section a treatment chamber according to the invention, in which the method according to the invention is realized by means of a magnetron sputter source, FIG. 5 schematically and acquired in situ the treatment result developing during the substrate treatment and method management as a regulated method according to the present invention, FIG. 6 in top view the constellation of the magnetron magnet configuration such as was utilized in the unit according to FIG. 4 for the tests shown in the following, FIG. 7 to 13: achieved treatment result distributions in the form of coating thickness distribution, at different settings of the setting parameters utilized according to the invention, FIG. 14 schematic representation of the coating tilt attained according to the invention.

The fundamental principle of the production method according to the invention as well as the treatment chamber according to the invention will be introduced in conjunction with FIG. 1. In a vacuum receptacle 1, which, as depicted schematically, is electrically connected with the selection switch 3a to ground or, optionally, to another reference potential $\Phi_1$, a plasma discharge gap 5 is provided, as shown schematically with an electrode 5a and an electrode 5b. The plasma discharge gap 5 is operated electrically by means of a generator 7, which can be a DC, an AC, a DC+AC or an HF generator. It is understood, that the electrodes 5a, 5b are also implemented corresponding to the provided plasma discharge species as is familiar to the person skilled in the art.

On the other hand, as a selection switch 3b shows schematically, depending on the purpose of the application, the generator 7 can be connected electrically floating, at ground potential or connected to another reference potential $\Phi_2$, which, it is understood, can also be identical to $\Phi_1$.

Generator 7 has a modulation input $7_{MOD}$, at which basically the electric signal $E_5$ supplying the gap 5 can be modulated in time with respect to DC value and/or phase and/or amplitude and/or time trace.

The plasma discharge gap 5 is formed such that it generates an inhomogeneously density-distributed plasma. A two-dimensional inhomogeneous plasma density distribution is depicted in FIG. 1 at $\rho_{PL}$, for example with a density maximum M. The plasma density distribution $\rho_{PL}$ can be moved with a specified movement with respect to a substrate 9.

Although a person skilled in the art is also quite familiar with other measures for locally increasing the plasma density (for example moved plasma beam) and therewith to operate and to move an inhomogeneous plasma density distribution, FIG. 1 shows the feasibility of realizing this by means of magnetic fields. For this purpose in the plasma locally a magnetic field <H> is generated, for example with a coil configuration moved under control. Through the mechanical movement of the coil configuration L the magnetic field distribution in the discharge gap 5 is moved as is shown schematically with a motor drive 13 in FIG. 1. The movement imposed by drive 13 onto the coil configuration L is specified at control inputs $13_{sx}$, $13_{sy}$, each in the X and Y direction of the drive 13. Within the scope of the present invention it is essential that with respect to substrate carriers or the substrate 9 the inhomogeneous density distribution $\rho_{PL}$ of the plasma is imposed on a specified movement, which takes place according to FIG. 1 through the correspondingly specified movement of a magnetic field distribution in the plasma gap 5.

Instead of the modulation, or in addition to, of the electric supply signal $E_5$ of the plasma discharge gap 5 the substrate carrier or the substrate 9 can be connected to bias voltage with the aid of a signal generator 15, in principle again to DC, AC, AC+DC or HF. As shown schematically with a further selection switch 3c, this can be carried out with respect to ground potential or with respect to a further reference potential 3.

If this bias placement of the substrate carrier 9 is provided, the generator 15 preferably also comprises a modulation input $15_{MOD}$, at which the bias signal, as was already explained with respect to signal $E_5$ for operating the plasma discharge gap 5, is modulated or varied in time.

The following indicate:

$E_5$: the electric supply signal (current and/or voltage) of the plasma discharge, B(x(t), y(t)): the x/y movement of the distribution $\rho_{PL}$ with respect to the substrate, in abbreviated form denoted by B, $E_9$: the substrate bias signal.

If $E_5$, B or $E_9$, B, respectively, are periodic signals, the setting takes place correspondingly at $7_{MOD}$, $13_s$ or $15_{MOD}$, $13_s$, and, apart from the particular amplitudes, are set the time signal traces (pulse, trapezoid, triangle, sine, etc), also the signal period or frequency.

As was shown in conjunction with FIG. 1, the relative movement of the inhomogeneous plasma density distribution $\rho_{PL}$ with respect to the substrate surface to be treated can take place by displacement or movement of the plasma density distribution $\rho_{PL}$ with respect to receptacle 1. However, it is understood that it is entirely possible, optionally additionally, to move also the substrate carrier or the substrate 9 with respect to the receptacle 1. It is essential that, viewed over the treatment time, and according to a pattern settable with said movement, that the inhomogeneous plasma density distribution $\rho_{PL}$ sweeps over the substrate surface sequentially. As has been stated, the variation of the discharge voltage or of the discharge current and/or, if provided, of the bias voltage is simultaneously carried out on the substrate over time.

With respect to the movement of the inhomogeneous plasma density distribution $\rho_{PL}$ with respect to the substrate, reference must be made to the fact that this movement is two-dimensional (x, y).

Again highly schematically, in FIG. 2 a circular disk-shaped substrate 19 is depicted on a substrate carrier 21 in top view. A process chamber according to 1 of FIG. 1 is not shown in this illustration. At the plasma discharge gap, also not shown here, in the vacuum receptacle a plasma discharge PL is stationarily established with, as shown in FIG. 2, substantially two-dimensional inhomogeneous plasma density distribution $\rho_{PL}$. By means of drives $13_x$ and $13_y$ the substrate 19 with the substrate carrier 21 is displaced relative to the inhomogeneous density distribution $\rho_{PL}$, which is stationary in the chamber. With the control signal $13_{sx}$ the x movement of the substrate carrier is driven, with the control signal $13_{sy}$ the y movement.

For example, in FIG. 3 the traces over time t of the movement B(x,y) as well as of $E_5$ or $E_9$ are depicted. The movements $B_x$ and $B_y$ depicted in FIG. 3 have the same periods T, while the signal $E_5$ or $E_9$ has a period T'<T. In the periodic signals the mutual phase position is set, such as the phase position $\Delta\Phi_{xy}$ between movement in the X direction and movement in the Y direction, as well as the phase position between $E_5$ and, for example Bx, $\Delta\Phi_{EB}$. The periods of the two or three signals can be displaced with respect to one another by integer or non-integer rational factors. If they are periodic, the phase shift $\Delta\Phi_{xy}$, $\Delta\Phi_{EB}$ is preferably set and the signals are synchronized in the sense of a phase locking. Furthermore, for $B_x$, maxima and minima values $B_{maxx}$, $B_{minx}$ or the movement excursion $B_{Hx}$ are preferably set, similarly, as shown in FIG. 3, for the y movement component as well as $E_5$ or $E_9$. Further preferred the time traces of the particular signals, as shown in FIG. 3 on the trace of $B_x$ at (a), are set.

Through the appropriate selection in particular of said parameters and their mutual coordination according to the invention on the plasma-treated substrate surface the areal distribution of the working result is set.

Following courses of action as depicted in conjunction with FIGS. 1 and 2, etching profiles, of non-reactive or reactive etching processes, on the substrate surface can be set as working result. In plasma-enhanced chemical vapor deposition methods (PECVD) with the depicted course of action the areal profile of the coatings deposited on the considered substrate surface can also be set. If in reactive methods, or also in PEVCD methods, a constant partial reactive gas pressure is set above the substrate surface, the described approach permits specifically laying out the resulting areal distribution of the deposited coating specifically with respect to coating thickness or stoichiometry ratios.

As has been explained, it is also the essence of the present invention to move an inhomogeneous plasma density distribution $\rho_{PL}$ with respect to a substrate surface to be treated.

Pronounced inhomogeneous plasma density distributions are utilized in magnetron sputtering, in that here along the tunnel-shaped magnetic field loops regions of high plasma densities are generated above the target sputter surfaces. As was explained in the introduction, it is entirely customary in magnetron sputtering, in particular for reasons of increasing the target material utilization, to move the tunnel field regions, and therewith the inhomogeneous plasma density distribution, for example by providing moved magnet configurations beneath the target. Consequently, magnetron sputtering is nearly ideally suited for being employed in the approach according to the invention. The magnetron discharge can therein be operated with DC, with AC, with superimposed AC+DC or with HF. Furthermore, the sputtering can be reactive magnetron sputtering or nonreactive magnetron sputtering.

As explained in the introduction, the present invention had been worked out in response to requirements arising from magnetron sputtering coating techniques and, as was explained in conjunction with FIG. 1-3, expanded in principle to setting the effect or result distribution of a plasma treatment along a substrate surface.

FIG. 4 depicts a vacuum treatment chamber according to the invention in the form of a magnetron sputter coating chamber, in which the production method according to the invention is carried out. A vacuum chamber 30 is evacuatable via a pumping means 32. On a target backplate 44 is disposed a target 33 comprised of material to be sputtered. Behind the target backplate 44 a magnet system 35 is located outside of the vacuum chamber 30. This system comprises for example a rotationally movable magnet carrier plate 36, driven about a central axis A, with a configuration of permanent magnets 40 disposed asymmetrically with respect to it and for example kidney-shaped in top view—reference is made to FIG. 6. The magnets 40 of the magnet configuration can optionally be driven and, as indicated at R, in addition to their rotational movement ω, be also displaceable about axis A under radial driving. As shown schematically at H, by means of the magnet configuration 40 a pronounced inhomogeneous magnetic field is moved with respect to the substrate 45 on the substrate carrier 43.

The rotational movement of the magnet configuration 35 generated by a motor with control input $37_s$ is scanned by means of a detector configuration 37. The scanning pulses I of detector unit 37 are settably time-delayed τ at a unit 41; the output side, time-delayed pulses I(τ) trigger or synchronize the, for example, sinusoidal signal $E_5$. Consequently, returning to FIG. 3, τ is specified with $\Delta\Phi_{EB}$. At a further control input $38_s$ at generator 38, the excursion of the sinusoidal signal component of $E_5$ is set.

As depicted at 42, into the treatment chamber 30 leads a gas line for a working gas, preferably argon, and optionally via the same gas inlet, however preferably by means of a gas spray head, a reactive gas is introduced into the process chamber for reactive magnetron sputter coating.

If above the surface of the substrate 45 an at least approximately uniformly distributed partial pressure of the reactive gas is established, by setting the movement of the inhomogeneously density-distributed magnetron plasma and the time management of the plasma discharge power $E_5$ along the substrate surface, the distribution of the composition of the coating or the coating thickness distribution can be set.

According to FIG. 5, while carrying out the method according to the invention, by means of a measuring device 51, for example by means of ellipsometry, electrical resistance measurement, profile measurement of the surface by means of optical reflection methods, etc., with a stationary, optionally a moving, sensing element the distribution of the treatment result is acquired in situ on the surface of substrate 54. The measurement result x is compared in a difference unit 56 with a specified result distribution W. The comparison is carried out of the instantaneous result distribution, determined by measurement, for the treatment time which has already taken place, with a nominal distribution which is two-dimensionally applicable. Discrepancies between Actual (X) and Nominal (W) distribution are supplied via a computing unit R as setting signals $58_s$ of a generator unit 58 for the plasma discharge and/or a guide unit 60 for the movement of the inhomogeneous plasma density distribution $\rho_{PL}$ with respect to the substrate surface. Instead of such an in-situ regulation of the treatment effect during the development process, it is entirely possible after specified or specifiable treatment time segments to transfer the substrate from the treatment chamber into a measuring chamber while maintaining vacuum conditions, to acquire here the treatment result achieved up to this time or its distribution as an intermediate result, to move the substrate back into the treatment chamber and to continue here the process with appropriately adapted parameters with respect to the movement of the inhomogeneous plasma density distribution and the plasma discharge power $E_5$.

In the following results will be introduced, such as were attained with production methods carried out according to the present invention with magnetron sputter coating by means of a unit such as is depicted in principle in FIG. 5.

Test set-up:
Treatment chamber: CLC 200 BB281100×
Vacuum pump: Cryo CTI Cryogenics PJ9744445
Magnetron magnet system: MB 300DK ALNO2
DC Power supply: Pinnacle (Advanced Energy). supplemented with ad cup 10 kW M/N 315243E-100A
Coating thickness registration: Spectral ellipsometer WVASE M-2000F, Version 3.333
Substrates: 6" silicon wafers Magnetron sputter coating from aluminum targets in nitrogen-containing atmosphere with AlN
Mean value of discharge power: $<E_5>$–8 kW
Form of power modulation: sinusoidal
Power modulation frequency: 5.95 Hz Settable phase locking of the magnet configuration—rotation movement ω according to FIG. 4 with the power modulation of $E_5$
Settable modulation excursion of $E_5$ In FIG. 6 is depicted in top view the magnet system of the magnetron configuration driven at constant rotational speed ω.

Figure 7:
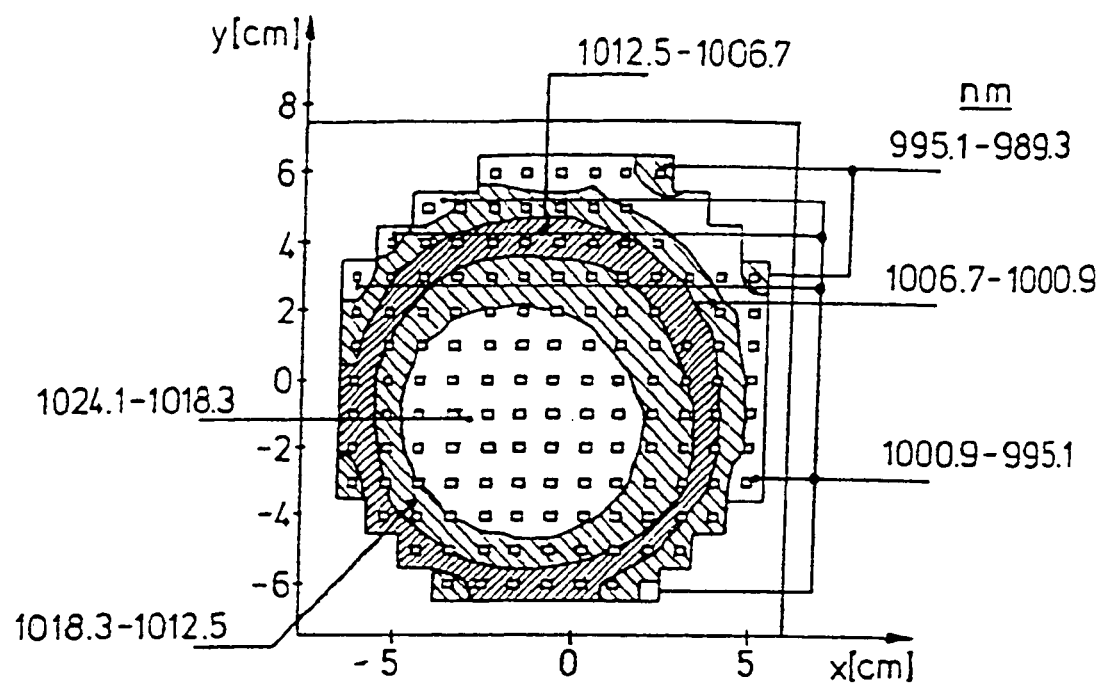

FIG. 7 shows the areal distribution on the 6" substrate of the treatment result, namely the reactive magnetron sputter coating with the AlN layer, a1: reference example without modulation of the discharge power $E_5$.

Figure 8:
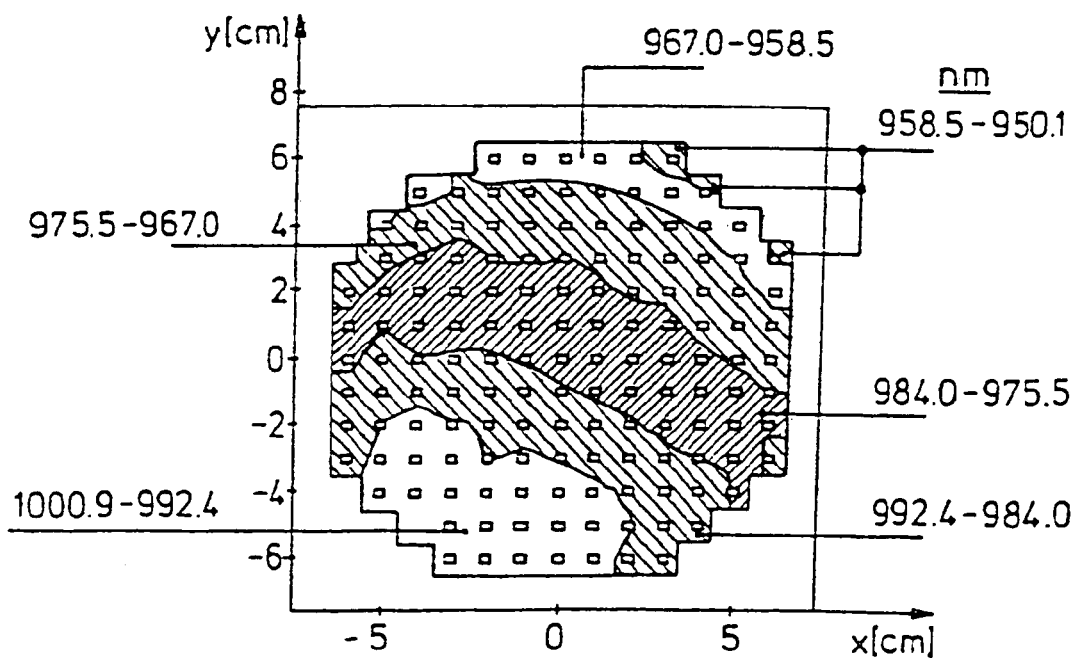

With a modulation excursion of 5.6%, the plasma power $E_5$ was now modulated at locked phase $\Delta\Phi_{EB}=0$. FIG. 8 shows the result.

Figure 9:
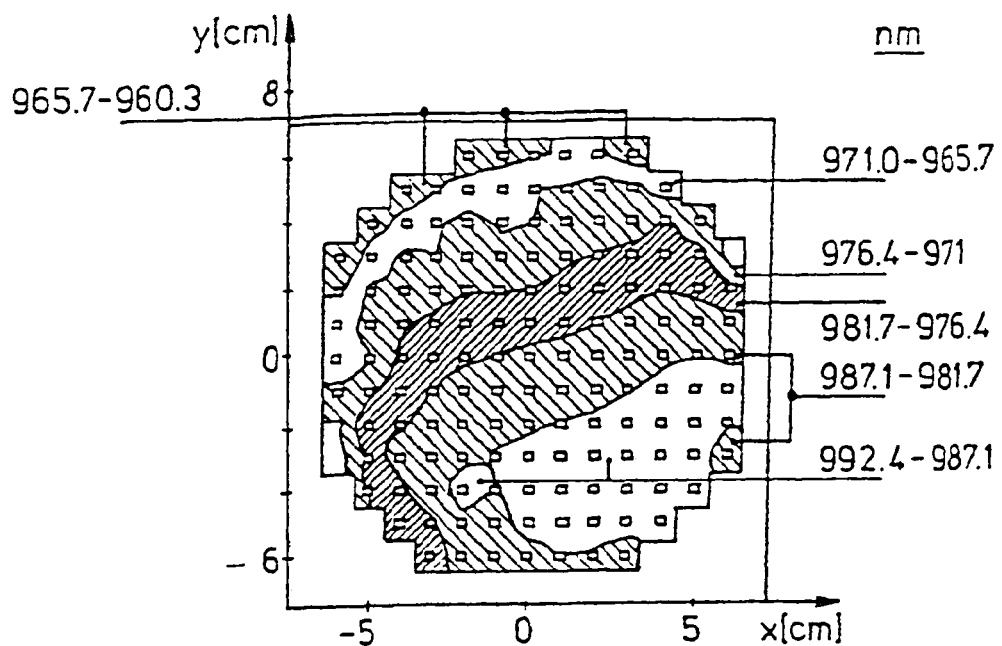

The coating thickness distribution according to FIG. 9 furthermore results at a modulation excursion of the discharge power $E_5$ of 5.6% at a locked phase $\Delta\Phi_{EB}$ of 90 degrees.

Figure 10:
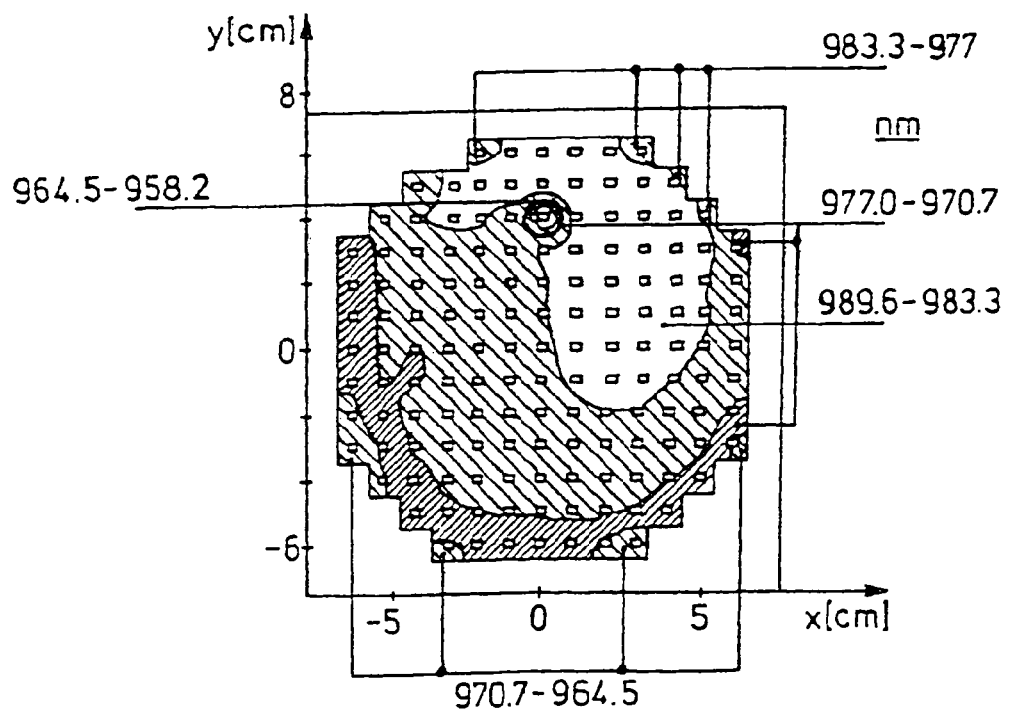
Figure 11:
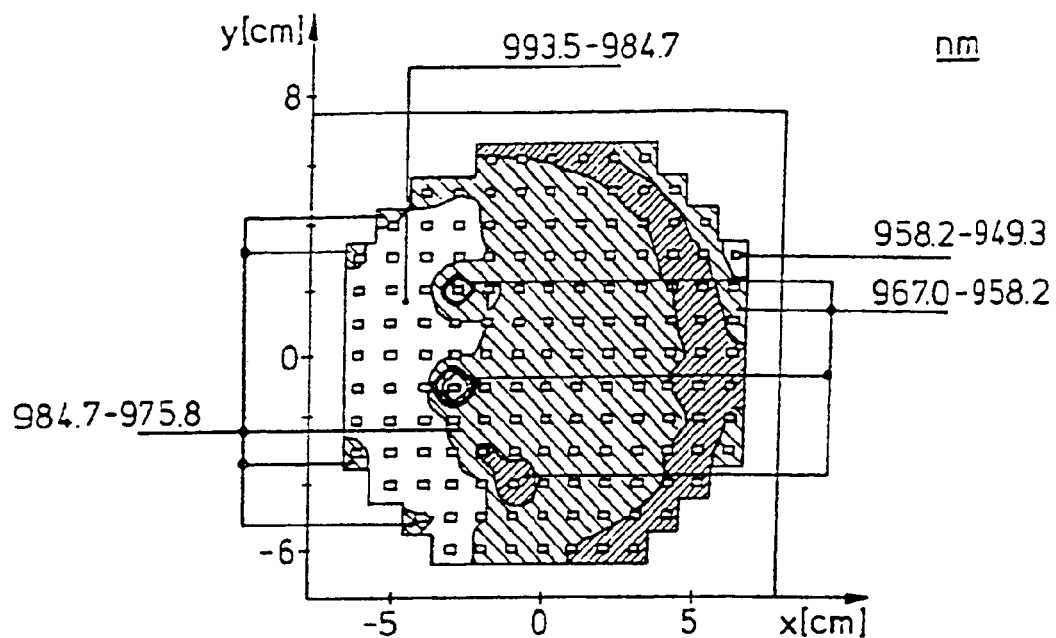

Moreover, when maintaining a modulation excursion of 5.6% and at further phase rotation to $\Delta\Phi_{EB}=180$ degrees, the distribution according to FIG. 10 was obtained. When further increasing the phase difference $\Delta\Phi_{EB}$ to 270 degrees, the distribution became as shown in FIG. 11. Further, with constant modulation excursion, lastly, the phase position was optimized to $\Delta\Phi_{EB}=195$ degrees. The distribution depicted in FIG. 12 resulted.

To obtain the distribution according to FIG. 13 at constant phase position $\Delta\Phi_{EB}=195$ degrees according to FIG. 12, the modulation excursion was further raised from 5.6% to 8.7%.

The sequences, first with phase optimization, then with modulation excursion optimization, show the way in which according to the present invention by setting, on the one hand, the movement between inhomogeneously density-distributed plasma and the time variation of the plasma discharge supply signal, a desired areal effect-distribution, here distribution of the coating thickness, can be attained, for example according to FIG. 13 a desired azimuthal and radially maximally homogeneous, i.e. uniform coating thickness distribution.

FIG. 14 shows schematically a main application of the present invention from a slightly different viewpoint than the previous one. As has been stated, one of the distributions obtained according to the invention of a treatment result is the distribution of a coating thickness.

According to FIG. 14 on the surface T of a planar substrate a layer is deposited according to the inventive method, with the surface S and the distribution of thickness d along the surface T. If the system of coordinates $x_\tau/y_\tau$ and $z_\tau$ is placed onto the planar surface T of the substrate, at location $x_0/y_0$ the z-axis has the direction of the surface normal $N_\tau$ at said location. At the coating surface S now according to the invention at the same location $x_0/y_0$ the surface normal $N_s$ with respect to the direction of the surface normal $N_\tau$ is spatially tilted, corresponding to the system of coordinates in the surface S at location $x_0/y_0$. This tilting of the coating surface S with respect to the substantially planar substrate surface T, or also generally of a nonplanar surface T, is referred to as coating tilt. A significant application case of the present invention is laying out the coating tilt spatially according to prevailing conditions, and specifically optionally along the substrate surface T locally differently. The coating tilt for which the invention strives can therein at least in regions of the surface T be zero. In this case the direction $N_s$ coincides with direction $N_\tau$.

The invention claim is:

1. Method for the production of a substrate with a surface treated by a vacuum treatment process, the surface having a specified areal distribution of the treatment result, wherein a plasma discharge is established with a locally inhomogeneous density distribution having a noticeable regions of increased plasma density compared to other regions, the substrate is exposed to the effect of the inhomogeneously density-distributed plasma discharge, the distribution of the treatment result is established by establishing a specified relative movement of the inhomogeneous density distribution and of the substrate, establishing a specified time variation of the electric power signal supplying the discharge and/or of an optionally provided further electric signal which connects the substrate to bias voltage, wherein, in case that said electric power signal or said further electric signal is an AC signal, said specified time variation of said signal addresses its angle or amplitude variations, setting said variation and said movement.

2. Method as claimed in claim 1, characterized in that the plasma discharge is established with at least one region of a pronounced density maximum.

3. Method as claimed in claim 1, characterized in that the specified relative movement of the inhomogeneous density distribution and of the substrate is at least also realized by moving the substrate with respect to a vacuum receptacle, in which the discharge is established.

4. Method as claimed in claim 1, characterized in that the specified relative movement is realized by a specified movement of the inhomogeneous density distribution with respect to a vacuum receptacle in which the discharge is generated.

5. Method as claimed in claim 1, characterized in that the inhomogeneous density distribution is at least also jointly generated by means of a magnetic field.

6. Method as claimed in claim 5, characterized in that the magnetic field distribution is moved locally in the receptacle in which the discharge is established.

7. Method as claimed in claim 1, characterized in that the plasma discharge and/or the biasing is generated by means of DC, AC, DC and superimposed AC or HF supply.

8. Method as claimed in claim 1, characterized in that the substrate is placed at bias voltage by means of DC, AC, DC and superimposed AC or HF supply.

9. Method as claimed in claim 1, characterized in that the vacuum treatment process is a magnetron sputter process and the specified relative movement comprises a specified movement of the magnetron magnetic tunnel field with respect to a target sputter surface.

10. Method as claimed in claim 1, characterized in that the specified relative movement as well as the specified time variation is each established to be periodic and relative movement and variation are synchronized.

11. Method as claimed in claim 1, characterized in that with the aid of the discharge a solid substance is released into the treatment atmosphere, into which said atmosphere a reactive gas is introduced and the distribution of the compound relationship between solid substance and components of the reactive gas on the surface is set as the treatment result.

12. Method as claimed in claim 1, characterized in that the treatment result is a coating of the surface.

13. Method as claimed in claim 1, characterized in that the treatment result is the etching of the treatment surface.

14. Method as claimed in claim 1, characterized in that before the end of the treatment, an intermediate treatment result is measured and compared with a nominal intermediate treatment result, and therewith the specified relative movement and/or the time variation is readjusted as a function of the comparison result.

15. Method as claimed in claim 14, characterized in that the measurement of the treatment intermediate result takes place without vacuum interruption.

16. Method as claimed in claim 15, characterized in that the measurement takes place in situ during the substrate treatment and the measurement result is applied to a control circuit as measured controlled variable which sets the specified relative movement and/or the time variation as the correcting variable for a treatment result regulation.

17. Method as claimed in claim 1, characterized in that the substrate is kept stationary during the treatment and with respect to the vacuum receptacle.

18. Use of the method as claimed in claim 1 for the production of coated workpieces with specified distribution of the coating thickness along a specified surface region of a carrier.

19. Use of the method as claimed in claim 1 for the production of components operating on the basis of acoustic surface waves (SAW) or of "bulk acoustic waves" (BAW).

20. Plasma treatment chamber with a substrate carrier as well as a plasma source, which is formed by a magnetron sputter source with a multipart target or in which the substrate carrier is not movable, wherein a magnet configuration is provided which generates in the treatment chamber an inhomogeneous magnetic field and which is operationally connected with a controllable driving configuration, by means of which the inhomogeneously distributed field is moved under control in the chamber, that further a plasma discharge gap is provided connected to a controllable generator configuration.

21. Plasma treatment chamber as claimed in claim 20, characterized in that the controllable driving configuration generates a periodic movement of the inhomogeneously distributed field in the chamber and the generator configuration generates a periodic output signal and that generator configuration and driving configuration are synchronized.

22. Plasma treatment chamber as claimed in claim 21, characterized in that the controllable driving configuration is the driving configuration of a magnetron magnet configuration.

* * * * *